United States Patent
Sato

(10) Patent No.: US 8,828,747 B2
(45) Date of Patent: Sep. 9, 2014

(54) PATTERN FORMING METHODS AND SEMICONDUCTOR DEVICE MANUFACTURING METHOD

(71) Applicant: Kabushiki Kaisha Toshiba, Tokyo (JP)

(72) Inventor: Hironobu Sato, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 13/767,168

(22) Filed: Feb. 14, 2013

(65) Prior Publication Data

US 2014/0038318 A1   Feb. 6, 2014

(30) Foreign Application Priority Data

Aug. 2, 2012   (JP) ................................. 2012-172158

(51) Int. Cl.
- *H01L 21/66*   (2006.01)
- *H01L 21/31*   (2006.01)
- *B05D 1/36*   (2006.01)

(52) U.S. Cl.
CPC . *B05D 1/36* (2013.01); *H01L 22/20* (2013.01)
USPC .......................................................... 438/14

(58) Field of Classification Search
None
See application file for complete search history.

(56) References Cited

U.S. PATENT DOCUMENTS

| | | | | |
|---|---|---|---|---|
| 7,189,435 | B2 * | 3/2007 | Tuominen et al. | 427/472 |
| 7,347,953 | B2 * | 3/2008 | Black et al. | 216/83 |
| 7,361,420 | B2 | 4/2008 | Yasui et al. | |
| 7,521,094 | B1 * | 4/2009 | Cheng et al. | 427/532 |
| 8,039,056 | B2 * | 10/2011 | Hasegawa et al. | 427/264 |
| 8,329,001 | B2 | 12/2012 | Yasui et al. | |
| 8,636,914 | B2 * | 1/2014 | Nakamura et al. | 216/41 |
| 2006/0078681 | A1 * | 4/2006 | Hieda et al. | 427/307 |
| 2006/0213426 | A1 | 9/2006 | Yasui et al. | |
| 2008/0182014 | A1 | 7/2008 | Yasui et al. | |
| 2009/0200646 | A1 * | 8/2009 | Millward et al. | 257/632 |
| 2010/0297847 | A1 * | 11/2010 | Cheng et al. | 438/694 |
| 2011/0147984 | A1 * | 6/2011 | Cheng et al. | 264/220 |
| 2011/0281085 | A1 | 11/2011 | Tada et al. | |
| 2012/0028476 | A1 * | 2/2012 | Li et al. | 438/780 |
| 2012/0058435 | A1 * | 3/2012 | Seino et al. | 430/324 |
| 2012/0331428 | A1 * | 12/2012 | Cheng et al. | 716/52 |

FOREIGN PATENT DOCUMENTS

| | | |
|---|---|---|
| JP | 2006-297581 | 11/2006 |
| JP | 2008-36491 | 2/2008 |
| JP | 2011-243655 | 12/2011 |

* cited by examiner

*Primary Examiner* — Scott B Geyer
(74) *Attorney, Agent, or Firm* — Finnegan, Henderson, Farabow, Garrett & Dunner, L.L.P.

(57) ABSTRACT

According to one embodiment, a pattern forming method includes forming a self-assembled material on a plurality of first patterns, forming a plurality of second patterns by heating the self-assembled material and causing microphase separation of the self-assembled material, the second patterns corresponding to the first patterns, and calculating positional deviations of respective positions of the second patterns from positions of the corresponding first patterns. When at least one of the positional deviations is larger than a predetermined value, the self-assembled material is adjusted.

20 Claims, 5 Drawing Sheets

F I G. 2A
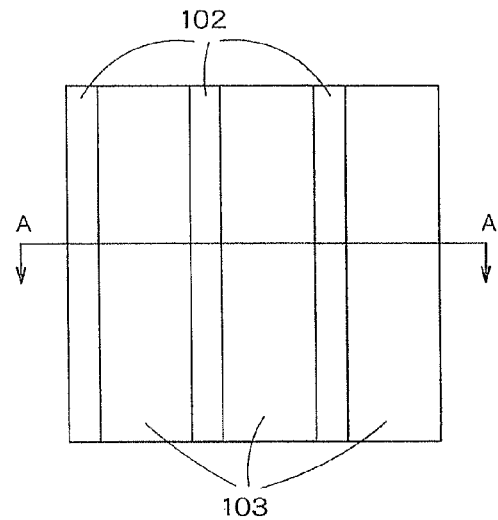
F I G. 2B
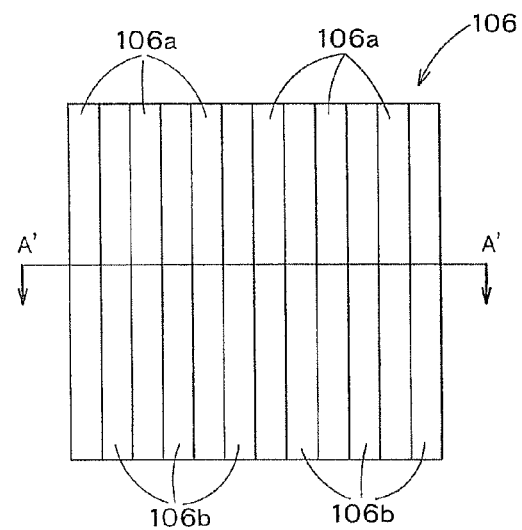

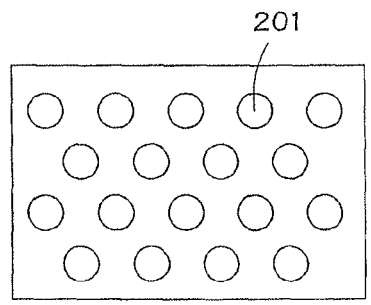
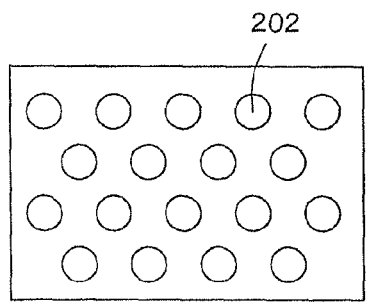
FIG. 4A  FIG. 4B
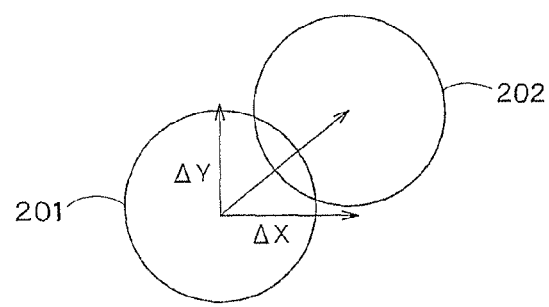
FIG. 5
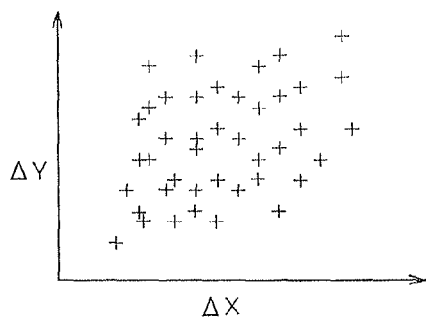
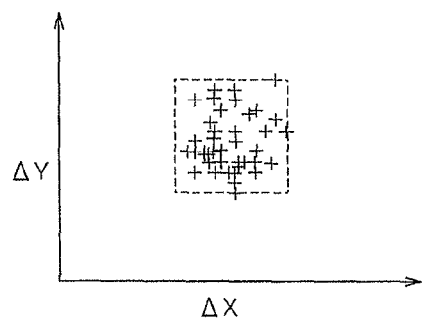
FIG. 6A  FIG. 6B

PATTERN FORMING METHODS AND SEMICONDUCTOR DEVICE MANUFACTURING METHOD

CROSS REFERENCE TO RELATED APPLICATION

This application is based upon and claims benefit of priority from the Japanese Patent Application No. 2012-172158, filed on Aug. 2, 2012, the entire contents of which are incorporated herein by reference.

FIELD

Embodiments described herein relate generally to a pattern forming method and a semiconductor device manufacturing method.

BACKGROUND

Known lithography techniques to be used during procedures for manufacturing semiconductor elements include a double-patterning technique using ArF immersion exposure, EUV lithography, nanoimprint, and the like. As patterns have become smaller, those conventional lithography techniques entail various problems such as higher costs and lower throughputs.

Under such circumstances, applications of directed self-assembly (DSA) to the lithography techniques are expected. Directed self-assembly occurs through the spontaneous behavior of energy stabilization, and accordingly, can contribute to formation of patterns with high size precision. Particularly, by a technique utilizing microphase separation of a polymeric block copolymer, periodic structures that are of various shapes and of several to hundreds of nanometers can be formed through simple coating and annealing processes. Spheres, cylinders, lamellas, or the like can be formed depending on the composition ratio in the blocks of the polymeric block copolymer, and sizes can vary depending on the molecular weight. In this manner, dot patterns, hole patterns, pillar patterns, line patterns, or the like of various sizes can be formed.

The positions of phase separation patterns of a self-assembled material have fluctuations that cannot be artificially controlled. In a case where patterns of interconnects, contact holes, and the like are formed by using a self-assembled material, the fluctuations need to be restrained, and the accuracy of alignment between the upper-layer patterns and the lower-layer patterns needs to be increased.

BRIEF DESCRIPTION OF THE DRAWINGS

FIG. 2A is a diagram showing an example of chemical guides;

FIG. 2B is a diagram showing an example of microphase separation patterns;

FIG. 4A is a diagram showing an example of circular patterns in a lower layer;

FIG. 4B is a diagram showing an example of hole patterns in an upper layer;

FIG. 5 is a diagram showing a positional deviation of a hole pattern;

FIGS. 6A and 6B are graphs showing example results of measurement of positional deviations of hole patterns;

DETAILED DESCRIPTION

According to one embodiment, a pattern forming method includes forming a self-assembled material on a plurality of first patterns, forming a plurality of second patterns by heating the self-assembled material and causing microphase separation of the self-assembled material, the second patterns corresponding to the first patterns, and calculating positional deviations of respective positions of the second patterns from positions of the corresponding first patterns. When at least one of the positional deviations is larger than a predetermined value, the self-assembled material is adjusted.

Figure 3A:
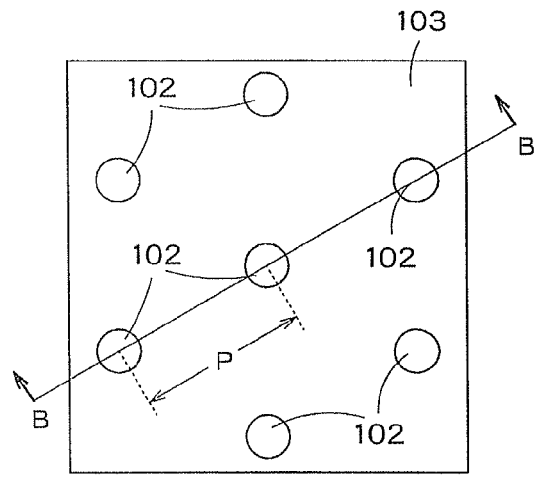
FIG. 3A is a diagram showing an example of chemical guides.
Figure 3B:
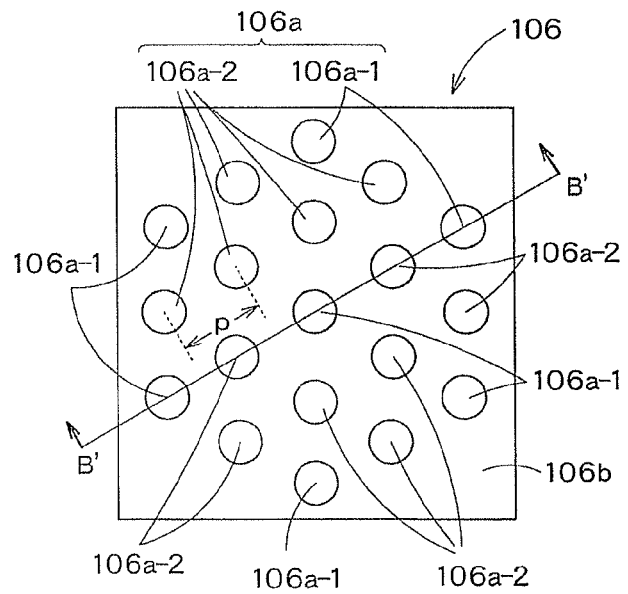
FIG. 3B is a diagram showing an example of microphase separation patterns.

Prior to explanation of this embodiment, an example method of forming microphase separation patterns of a self-assembled material using a chemical guide layer is first described. FIGS. 1A-1F are cross-sectional process views, FIGS. 2A and 3A are diagrams showing examples of chemical guides, and FIGS. 2B and 3B are diagrams showing examples of microphase separation patterns. The cross-sections taken along the lines A-A, A'-A', B-B, and B'-B' shown in FIGS. 2A, 2B, 3A, and 3B are equivalent to the cross-sectional views shown in FIGS. 1A-1F. FIGS. 2A and 2B concern an example in which lamellar microphase separation patterns are formed, and FIGS. 3A and 3B concern an example in which cylindrical microphase separation patterns are formed.

Figure 1A:
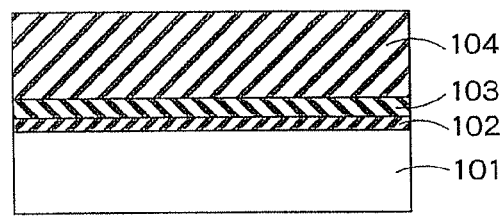
FIGS. 1A-1F are cross-sectional process views for explaining an example method of forming microphase separation patterns of a self-assembled material, using chemical guides.

As shown in FIG. 1A, a reflection prevention film 102 is formed on a substrate 101, and a neutralization film 103 and a resist film 104 are formed in this order on the reflection prevention film 102. The neutralization film 103 has the same affinity for all the components in the self-assembled material to be applied in a later procedure. The reflection prevention film 102 may be omitted, if reflection from the substrate 101 is sufficiently low.

Figure 1B:
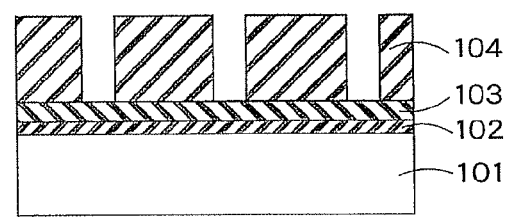

As shown in FIG. 1B, a desired pattern is then formed in the resist film 104 by lithography.

Figure 1C:
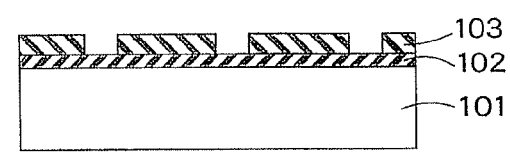

As shown in FIG. 1C, with the resist film 104 serving as a mask, etching is performed on the neutralization film 103, to transfer the resist pattern to the neutralization film 103. The resist film 104 is then removed. As a result, chemical guides formed with the reflection prevention film 102 and the neutralization film 103 are obtained. FIGS. 2A and 3A are the top views of chemical guides at this stage.

Figure 1D:
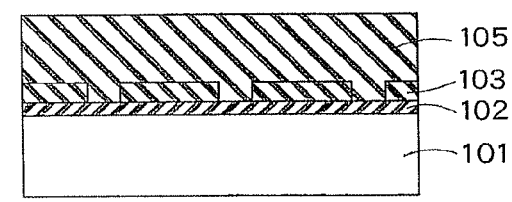

As shown in FIG. 1D, a self-assembled material 105 is then applied onto the reflection prevention film 102 and the neutralization film 103. The self-assembled material applied here may be a diblock copolymer having first polymer block chains and second polymer block chains bound to one another, for example. As the diblock copolymer, a block copolymer including polystyrene (PS) and polymethylmethacrylate (PMMA) can be used, for example. By adjusting the composition of PS and PMMA, a lamellar structure or a cylindrical structure can be obtained at the time of phase separation.

Figure 1E:
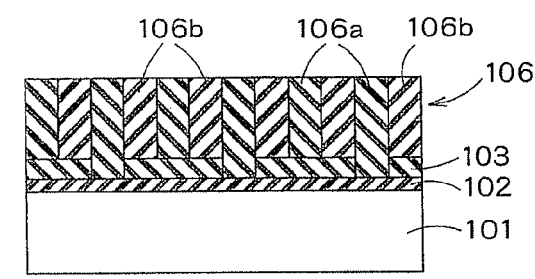

As shown in FIG. 1E, the self-assembled material 105 is heated, to form microphase separation patterns 106. In the microphase separation patterns 106, first polymer portions 106a formed with first polymer block chains and second polymer portions 106b formed with second polymer block chains are phase-separated, to form lamellar patterns shown in FIG. 2B or cylindrical patterns shown in FIG. 3B.

In this example, the affinity between the reflection prevention film 102 and the first polymer block chains is higher than the affinity between the reflection prevention film 102 and the second polymer block chains, and the reflection prevention film 102 serves as a pinning layer that secures (pins) the first polymer portions 106a. For example, the self-assembled material 105 is a block copolymer including polystyrene (PS) and polymethylmethacrylate (PMMA), and, in a case where the reflection prevention film 102 is SOG, the SOG has high affinity with the PMMA. Therefore, at the time of microphase separation, the PMMA is selectively formed on the reflection prevention film 102. That is, the first polymer portions 106a correspond to the PMMA, and the second polymer portions 106b correspond to the PS.

The microphase separation patterns 106 shown in FIG. 2B include thin plate-like first polymer portions 106a and second polymer portions 106b.

The microphase separation patterns 106 shown in FIG. 3B include cylinder-like first polymer portions 106a and second polymer portions 106b surrounding the first polymer portions 106a. The cylinder-like first polymer portions 106a include cylindrical portions 106a_1 secured to the reflection prevention film 102, and cylindrical portions 106a_2 formed on the portions of the neutralization film 103 between the cylindrical portions 106a_1 in an interpolating manner.

Figure 1F:
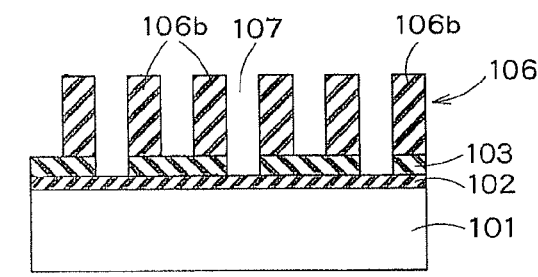

As shown in FIG. 1F, the first polymer portions 106a are then selectively removed. The thin plate-like first polymer portions 106a shown in FIG. 2B are selectively removed, to form line patterns 107. The cylindrical first polymer portions 106a shown in FIG. 3B are selectively removed, to form hole patterns 107.

Although an example in which the microphase separation patterns 106 are formed on the chemical guides formed with the reflection prevention film 102 and the neutralization film 103 has been described, the material of the chemical guides is not limited to the above. Also, the microphase separation patterns 106 may be formed by using physical guides, instead of the chemical guides.

The positions where the microphase separation patterns 106 are formed vary depending on processing conditions or the like. Accordingly, the positions where line patterns or hole patterns are formed by selectively removing the first polymer portions 106a also vary. According to an embodiment of the present invention, deviations of the pattern formation positions can be restrained, and the accuracy of alignment with other patterns formed in an upper layer or a lower layer can be increased. The following is a description of an embodiment of the present invention, with reference to the accompanying drawings.

This is a description of an example case where hole patterns 202 shown in FIG. 4B are formed on circular patterns 201 shown in FIG. 4A by using microphase separation of a self-assembled material. The respective hole patterns 202 correspond to the respective circular patterns 201.

In this embodiment, positional deviations of the respective hole patterns 202 are measured, with the positions of the respective circular patterns 201 being references. As shown in FIG. 5, the positional deviation of each of the hole patterns 202 is expressed with $\Delta X$ and $\Delta Y$. The direction of $\Delta Y$ is perpendicular to the direction of $\Delta X$. Here, the position of each of the circular patterns 201 and the hole patterns 202 is the center of a circular shape, or is the center of gravity of an elliptical shape.

FIG. 6A shows example results of measurement carried out to measure positional deviations of all the hole patterns 202. In a case where the self-assembled material used for forming the hole patterns 202 has not been optimized, the accuracy of alignment between the circular patterns 201 and the hole patterns 202 is low, and the positional deviations of the respective hole patterns 202 spread over a wide area in the $\Delta X$-$\Delta Y$ plane, as shown in FIG. 6A. If a metal material is buried in such hole patterns 202 to form contacts, the contacts might not come in contact with the patterns in the lower layer, and conduction might not be achieved.

Next, the self-assembled material is adjusted. In a case where a diblock copolymer having first polymer block chains and second polymer block chains bound to one another is used as the self-assembled material, the molecular weight of the diblock copolymer may be changed, the composition ratio between the first polymer block chains and the second polymer block chains may be changed, or the molecules in the first polymer block chains or the second polymer block chains may be changed. Alternatively, either the first polymer block chains or the second polymer block chains are added to the diblock copolymer, or some other additive agent may be added to the diblock copolymer.

The self-assembled material is repeatedly adjusted until the results of measurement carried out to measure positional deviations of all the hole patterns 202 fall within a certain range as shown in FIG. 6B. If a metal material is buried in such hole patterns 202 to form contacts, the contacts come in contact with the patterns in the lower layer, and conduction is achieved.

As described above, the self-assembled material is repeatedly adjusted until the positional deviations of all the hole patterns 202 fall within a certain range. By using the thus adjusted self-assembled material, patterns with high alignment accuracy can be formed.

It should be noted that the formation of the circular patterns 201 and the formation of the hole patterns 202 using the adjusted self-assembled material may be actually performed, or may be simulated.

Figure 7:
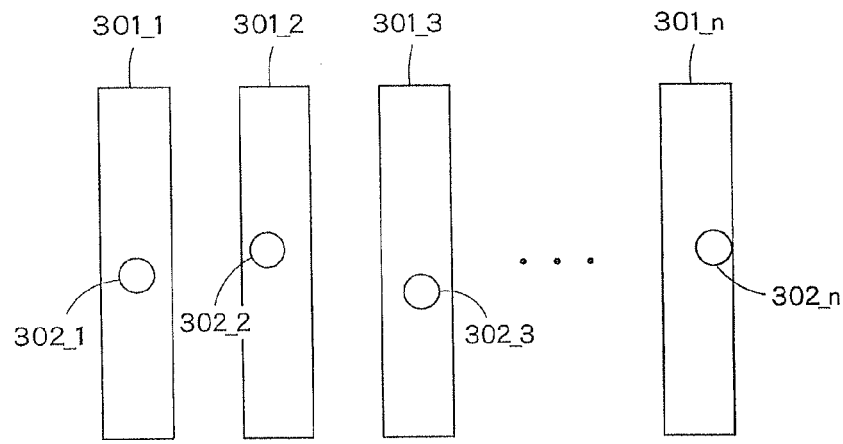
FIG. 7 is a diagram showing an example of interconnect patterns in a lower layer and an example of hole patterns in an upper layer.

Although FIGS. 4 through 6 show an example case where hole patterns are formed on circular patterns, the same process as above can be performed in forming hole patterns on line patterns as shown in FIG. 7.

For example, as shown in FIG. 7, hole patterns 302_1 through 302_$n$ are formed on n interconnects (rectangular patterns) 301_1 through 301_$n$ in one-to-one correspondence, by using microphase separation of a self-assembled material. The hole patterns 302_1 through 302_$n$ are patterns corresponding to the contacts for the interconnects 301_1 through 301_$n$. Where deviations of the actual positions (or simulated positions) of the hole patterns 302_1 through 302_$n$ from ideal positions (reference positions) of the hole patterns 302_1 through 302_$n$ are represented by $\Delta r_i$ (i=1, 2, . . . , n), and the allowable positional deviations of the hole patterns 302_1 through 302_$n$ are represented by $m_i$ (i=1, 2, . . . , n), the self-assembled material is adjusted so as to satisfy $|\Delta r_i| \leq m_i$ (i=1, 2, . . . , n).

Where the actual positions of the hole patterns 302_1 through 302_$n$ are represented by $(X_i, Y_i)$, and the ideal positions (the reference positions) of the hole patterns 302_1 through 302_$n$ are represented by $(x_i, y_i)$, $\Delta r_i$ can be expressed by the following formula 1:

$$\Delta r_i = \sqrt{(X_i - x_i)^2 + (Y_i - y_i)^2} \qquad \text{[Formula 1]}$$

In the example illustrated in FIG. 7, the positional deviation of the layer in which the interconnects 301_1 through 301_n are formed may be taken into consideration. For example, where the positional deviation of the layer in which the hole patterns 302_1 through 302_n are formed from the layer in which the interconnects 301_1 through 301_n are formed is represented by Δd, the self-assembled material is adjusted so as to satisfy $|\Delta r_i + \Delta d| \leq m_i$ (i=1, 2, ..., n).

Figure 8:
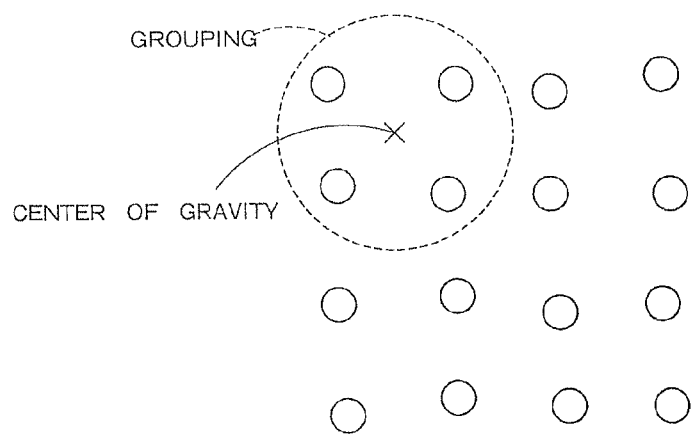
FIG. 8 is a diagram showing an example of grouping of hole patterns.

In the above described embodiment, the respective positions of the hole patterns are measured, to determine the positional deviations from the target values (the ideal values). However, it is also possible to put some hole patterns into a group, and determine the positional deviation of the position of the gravity center of the group from a target value (an ideal value), as shown in FIG. 8. In a case where contact holes are formed by using physical guide patterns, for example, some contact holes in the same physical guide pattern are put into a group.

Also, in the above described embodiment, hole patterns are formed by using microphase separation of a self-assembled material. However, line patterns may be formed instead. In that case, a deviation of the gravity center of each line pattern from a target value (an ideal value) is determined, and the self-assembled material is adjusted so that the deviation becomes equal to or smaller than a predetermined value.

The procedures for manufacturing a semiconductor device may include detection of the positions of patterns formed by using microphase separation of a self-assembled material, and determination as to whether the deviations from target positions are equal to or smaller than a predetermined value.

Figure 9:
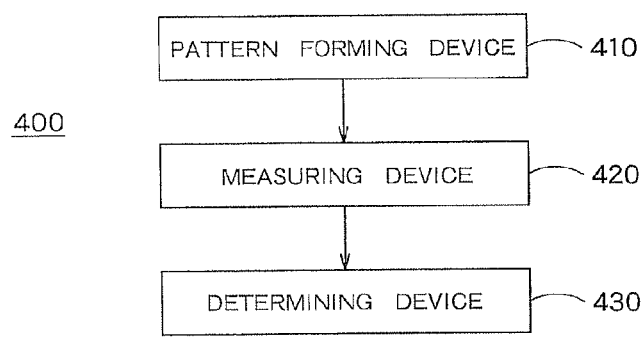
FIG. 9 is a diagram schematically showing the structure of a semiconductor manufacturing system according to this embodiment.

For example, a pattern forming device 410 of a semiconductor manufacturing system 400 shown in FIG. 9 forms hole patterns or line patterns by utilizing microphase separation of a self-assembled material in each chip on a wafer. A measuring device 420 then extracts a chip from one wafer, and measures the locations of all the patterns in the extracted chip. A determining device 430 then calculates the positional deviations of the measured positions of the formed patterns from target values (ideal values), and determines whether the positional deviations of all the patterns are equal to or smaller than a predetermined value. If the positional deviations of all the patterns are equal to or smaller than the predetermined value, the operation moves on to the next step. If the positional deviation of one or more (or a predetermined number) of patterns is larger than the predetermined value, the wafer is determined not to be used in the semiconductor device production. In this manner, a semiconductor device can be checked by using the positional deviations of all the microphase separation patterns in each one chip.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming a self-assembled material on a plurality of first patterns;
    forming a plurality of second patterns by heating the self-assembled material and causing microphase separation of the self-assembled material, the second patterns corresponding to the first patterns;
    calculating positional deviations of respective positions of the second patterns from positions of the corresponding first patterns; and,
    when at least one of the positional deviations is larger than a predetermined value, adjusting the self-assembled material.

2. The pattern forming method according to claim 1, wherein
    the self-assembled material includes a diblock copolymer having a first polymer block chain and a second polymer block chain bound to each other, and
    the adjusting the self-assembled material includes changing a molecular weight of the diblock copolymer, changing a composition ratio between the first polymer block chain and the second polymer block chain, adding one of the first polymer block chain and the second polymer block chain, or adding an additive agent.

3. The pattern forming method according to claim 1, wherein the forming the second patterns by using the adjusted self-assembled material, the calculating the positional deviations, and the adjusting the self-assembled material are repeated until all the calculated positional deviations become equal to or smaller than the predetermined value.

4. The pattern forming method according to claim 1, wherein the positional deviations include a positional deviation of a first layer from a second layer located below the first layer, the first patterns and the second patterns being formed in the first layer.

5. The pattern forming method according to claim 1, wherein the second patterns are circular patterns.

6. The pattern forming method according to claim 5, wherein the first patterns are circular patterns or rectangular patterns.

7. The pattern forming method according to claim 6, wherein a plurality of circular patterns corresponding to a rectangular pattern are put into a group, and a positional deviation of the gravity center of the group of the circular patterns from a position of the corresponding rectangular pattern is calculated.

8. The pattern forming method according to claim 1, wherein a plurality of second patterns corresponding to a first pattern are put into a group, and a positional deviation of the gravity center of the group of the second patterns from a position of the corresponding first pattern is calculated.

9. A pattern forming method comprising:
    forming a self-assembled material on a plurality of first patterns; and
    forming a plurality of second patterns by heating the self-assembled material and cause microphase separation of the self-assembled material, the second patterns corresponding to the first patterns, wherein
    the self-assembled material is adjusted to cause positional deviations of respective positions of the second patterns from positions of the corresponding first patterns to become equal to or smaller than a predetermined value.

10. The pattern forming method according to claim 9, wherein the positional deviations include a positional deviation of a first layer from a second layer located below the first layer, the first patterns and the second patterns being formed in the first layer.

11. The pattern forming method according to claim 9, wherein the second patterns are circular patterns.

12. The pattern forming method according to claim 11, wherein the first patterns are circular patterns or rectangular patterns.

13. The pattern forming method according to claim 12, wherein a plurality of circular patterns corresponding to a rectangular pattern are put into a group, and a positional deviation of the gravity center of the group of the circular patterns from a position of the corresponding rectangular pattern is calculated.

14. The pattern forming method according to claim 9, wherein a plurality of second patterns corresponding to a first pattern are put into a group, and a positional deviation of the gravity center of the group of the second patterns from a position of the corresponding first pattern is calculated.

15. A semiconductor device manufacturing method comprising:

forming a self-assembled material on a plurality of first patterns in respective chips on a wafer;

forming a plurality of second patterns by heating the self-assembled material and causing microphase separation of the self-assembled material, the second patterns corresponding to the first patterns;

extracting one of the chips;

in the extracted chip, calculating positional deviations of respective positions of the second patterns from respective positions of the corresponding first patterns; and based on the number of the second patterns having larger positional deviations than a predetermined value, determining whether to use the wafer in semiconductor device production.

16. The semiconductor device manufacturing method according to claim 15, wherein the positional deviations include a positional deviation of a first layer from second layer located below the first layer, the first patterns and the second patterns being formed in the first layer.

17. The semiconductor device manufacturing method according to claim 15, wherein the second patterns are circular patterns.

18. The semiconductor device manufacturing method according to claim 17, wherein the first patterns are circular patterns or rectangular patterns.

19. The semiconductor device manufacturing method according to claim 18, wherein a plurality of circular patterns corresponding to a rectangular pattern are put into a group, and a positional deviation of the gravity center of the group of the circular patterns from a position of the corresponding rectangular pattern is calculated.

20. The semiconductor device manufacturing method according to claim 15, wherein a plurality of second patterns corresponding to a first pattern are put into a group, and a positional deviation of the gravity center of the group of the second patterns from a position of the corresponding first pattern is calculated.

* * * * *